United States Patent

Strauch et al.

Patent Number: 5,861,823
Date of Patent: Jan. 19, 1999

[54] DATA ENTRY DEVICE HAVING MULTIFUNCTION KEYS

[75] Inventors: Gary J. Strauch, Amherst; Paul Smola, Bedford, both of N.H.

[73] Assignee: Granite Communications Incorporated, Nashaua, N.H.

[21] Appl. No.: 7,903

[22] Filed: Jan. 15, 1998

Related U.S. Application Data

[62] Division of Ser. No. 831,752, Apr. 1, 1992, abandoned.

[51] Int. Cl.[6] .................................................. H03H 25/00
[52] U.S. Cl. .............................. 341/22; 341/20; 345/168; 379/369; 200/5 R; 200/6 R
[58] Field of Search .................................. 341/20, 22, 23; 200/512, 513, 6 R, 16 D, 18, 339, 5 E, 1 R, 5 R; 345/168, 160; 379/369

[56] References Cited

U.S. PATENT DOCUMENTS

| | | | |
|---|---|---|---|
| 4,499,342 | 2/1985 | Nakayama | 200/5 E |
| 4,506,118 | 3/1985 | Mollan | 200/1 R |
| 4,520,240 | 5/1985 | Swindler | 200/5 R |
| 4,590,338 | 5/1986 | Suzuki | 200/5 R |
| 4,680,577 | 7/1987 | Straayer et al. | 345/160 |
| 4,698,464 | 10/1987 | Tanaka et al. | 200/18 |
| 4,769,516 | 9/1988 | Allen | 200/5 R |
| 4,778,295 | 10/1988 | Bleuer | 200/339 |
| 4,891,777 | 1/1990 | Lapeyre | 364/706 |
| 4,896,003 | 1/1990 | Hsieh | 200/6 A |
| 4,975,547 | 12/1990 | Nakayama et al. | 200/5 R |
| 5,087,910 | 2/1992 | Guyot-Sionnest | 341/22 |
| 5,164,554 | 11/1992 | Ikunami | 200/5 E |
| 5,172,101 | 12/1992 | Bates | 341/34 |
| 5,265,716 | 11/1993 | Sawada et al. | 200/5 R |
| 5,383,735 | 1/1995 | Smiley | 341/22 |
| 5,504,286 | 4/1996 | Tsai | 200/5 R |
| 5,528,235 | 6/1996 | Lin et al. | 341/22 |
| 5,543,818 | 8/1996 | Scott | 345/168 |

*Primary Examiner*—Michael Horabik
*Assistant Examiner*—Albert K. Wong
*Attorney, Agent, or Firm*—Hoffman, Wasson & Giltler

[57] ABSTRACT

A data entry device is provided, having as its primary function the entry of numeric data. A secondary function is the entry of alphabetic characters. The device is operated with a single hand and requires no shift or function keys. The number of keys of the device is kept to a minimum to avoid visual clutter and to facilitate its use with one hand. The keys are designed to be easy to access and to be operated while wearing a glove.

17 Claims, 4 Drawing Sheets

DATA ENTRY DEVICE HAVING MULTIFUNCTION KEYS

This is a divisional of Ser. No. 08/831,752, filed Apr. 1, 1997, now abandoned.

BACKGROUND

1. Field of the Invention

The present invention relates to a data entry device having keys which have multiple functions. In particular the present invention relates to a data entry device having relatively few keys, compared to an ordinary or standard keyboard, and in which each key can produce three, four or five characters depending upon how the key is depressed. The data entry device eliminates the need for a shift key or function key which, in a conventional keyboard, must be depressed simultaneously with another key to produce a second function, such as capitalization or a second character.

2. Description of the Prior Art

A standard keyboard has keys corresponding to the 26 letters of the alphabet, numbers 0–9, punctuation, and other various commonly used symbols. Including a shift key, a control key and an alt key, the total number of keys is approximately 50 Most of the keys will produce a second character when depressed simultaneously with the shift key. Similarly, if the alt key or control key are depressed with one of the other keys, character different from the primary character will be produced.

While the standard keyboard is sufficient for normal use at a work station, it does not lend itself to use in hand-held devices, or other situations where a large keyboard would be awkward or inappropriate. For a hand-held device, a data entry device would preferably require only one hand to enter data. Consequently, a requirement of using a shift, control or alt key simultaneously with other keys would be a drawback.

Other arrangement of keyboards exist beside the standard arrangement. For example, U.S. Pat. No. 4,891,777 to Lapeyre is directed to a single hand keyboard array which provides alphanumeric capabilities from twelve keys. The keyboard is intended to be operated using one hand. The system employs virtual keys which are selected by simultaneous action of two or more individual keys. The apparatus decodes the signals produced by activation of the switches to produce the alphanumeric symbol desired.

U.S. Pat. 5,087,910 to Guyot-Sionnest pertains to an electronic keyboard for one-hand operation. The keyboard produces alphanumeric and analog characters upon the activation of one or more finger keys and a thumb key. The finger keys can each assume one of three states, and the thumb key can assume five different states. The keys can thereby, in combination, produce 134 different characters.

Another device is described in U.S. Pat. No. 5,543,818 to Scott which relates to a method and apparatus for entering text using an input device having a small number of keys. A display device, connected to a CPU, displays a character selection menu having sixteen groups of characters. An input device which includes four cursor movement keys and four selection keys to choose a desired character. The four cursor movement keys move the cursor on the display from one character group to another. The four selection keys determine which of four characters in a group is desired.

U.S. Pat. No. 4,680,577 to Straayer et al teaches a multipurpose cursor control keyswitch. The switch has an ordinary function of producing an alphanumeric symbol when depressed vertically, and directs cursor movement when horizontal pressure is applied. The Straayer et al keyswitch is not intended to reduce the number of keys and is not designed to facilitate one hand operation.

A multiple switch assembly including a rockable control plate for selectively actuating multiple microswitches is disclosed in U.S. Pat. No. 5,504,286 to Tsai. The assembly is intended to reduce the number of keys on the keyboard of a portable computer by employing rockable keys which can produce two characters without reducing the size of the keys. The keys can be pressed to either one of two sides corresponding to two different characters. The primary reason for reducing the number of keys is to accommodate a cursor movement device.

U.S. Pat. No. 4,769,516 to Allen relates to a finger operated switching apparatus. The keyboard utilizes keys which can produce three different characters. The keyboard is intended to replace a conventional keyboard and requires two hands for use.

U.S. Pat. No. 5,504,286 to Blauer pertains to a keyboard with elongate keys associated with compact switch mechanisms. The keyboard is intended to be used with both hands and is intended for use in a desk-top configuration. The keyboard has a series of keys which produce two or three outputs depending upon how the keys are depressed.

SUMMARY OF THE INVENTION

According to one aspect of the present invention, a data entry device is provided, having as its primary function the entry of numeric data. A secondary function is the entry of alphabetic characters. The device can be operated with a single hand and requires no shift or function keys. The number of keys on the device is kept to a minimum to avoid visual clutter and to facilitate its use with one hand. The keys are designed to be easy to access and to be operated while wearing a glove. The device may be hand-held, a telephone keypad, a television remote, or a computer keyboard.

It is an object of the present invention to provide a hand-held data entry device.

Another object of the present invention is to provide a data entry device having multifunction keys, which can produce more than one character depending upon how the key is depressed.

Still another object of the present invention is to provide a data entry device having multifunction keys which produce three different alphanumeric characters.

Yet another object of the present invention is to provide a data entry device having multifunction keys which produce four different alphanumeric characters.

Another object of the present invention is to provide a data entry device having multifunction keys, which can produce five different alphanumeric characters.

Still another object of the present invention is to provide a data entry device having multifunction keys which each have a central primary numeric character and secondary alphabetic characters.

Yet another object of the present invention is to provide a data entry device having multifunction keys which each have a central primary numeric character and secondary alphabetic characters, where the numeric character is produced by applying a primarily vertical force to the key and the secondary alphabetic characters are produced by applying additional force in secondary directions.

BRIEF DESCRIPTION OF THE DRAWINGS

The foregoing and other attributes of the present invention will be described with respect to the following drawings in which.

DETAILED DESCRIPTION OF THE INVENTION

Figure 1:
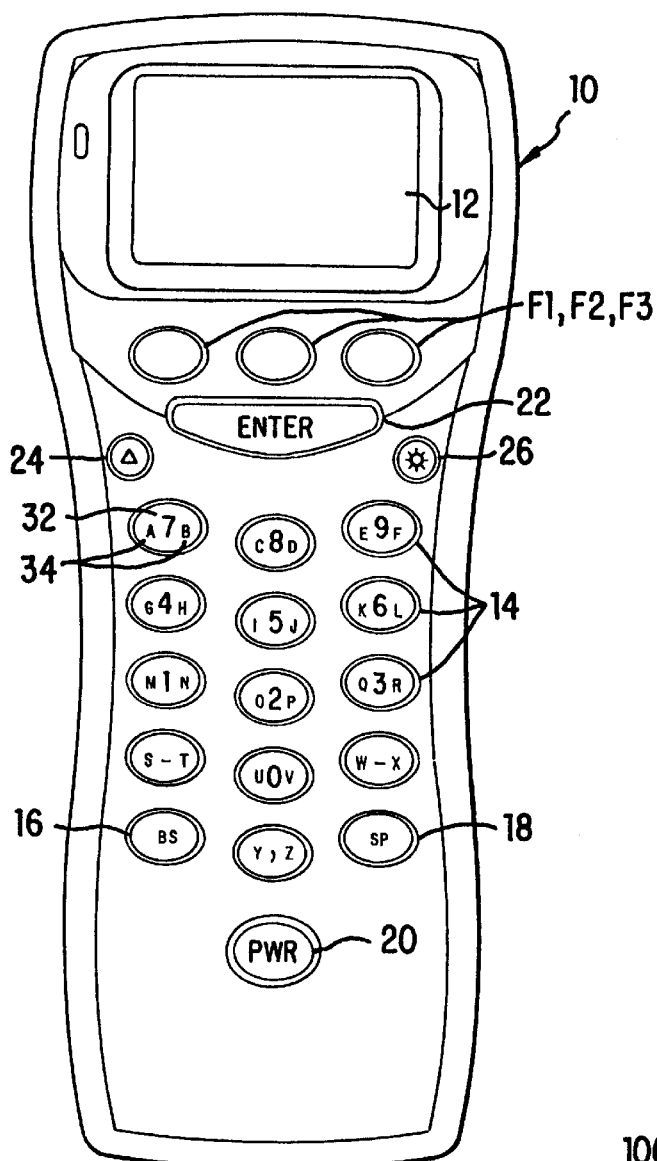
FIG. 1 is a top plan view of a first embodiment of the keyboard having multifunction keys according to the present invention.

Referring to FIG. 1, a first embodiment of the data entry device 10 according to the present invention is illustrated. The data entry device 10 has a housing 8 and a display 12, which is preferably a liquid crystal display (LCD). Thirteen multifunction keys 14 are provided as are a backspace key (BS) 16, a space key (SP) 18, an power key 20, an enter key 22, an ▲ key 24, a "*" key 26 and three function keys F1, F2, and F3.

Figure 2:
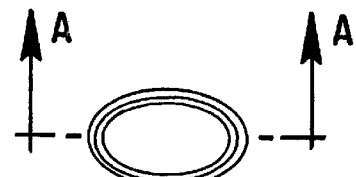
FIG. 2 is a top plan view of a single key of the keyboard shown in FIG. 1, according to the present invention.
Figure 3:
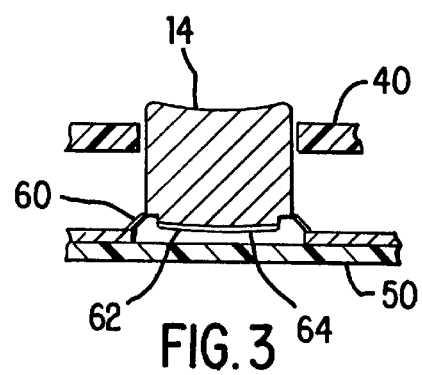
FIG. 3 is a cross-sectional view of the key shown in FIG>2 taken along line A—A.

The multifunction keys 14 of the first embodiment are shown in greater detail in FIGS. 2 and 3. The keys 14 of the first embodiment can produce three different characters depending upon how the keys are depressed. The keys 14 are oval in shape. The primary character 32 for each key 14 is displayed in the center of the key, while the secondary characters 34 for each key 14 are displayed to either side of the primary character.

Referring to FIG. 3, the keys 14 project up through openings in a housing 40 which forms the body of the data entry device 10. Keys 14 are disposed above a printed circuit board 50, and are resiliently biased away from the circuit board 50, by resilient arms 60. The underside of each key 14 has a convex profile 62, extending away from the upper side of the key 14, which forms an electrical actuator 64. The convex profile 62 is parallel to the lengthwise axis of the oval key 14. In the illustrated embodiment the resilient arms 60 are located on either side of convex profile 62 of the actuator 64.

Figure 6:
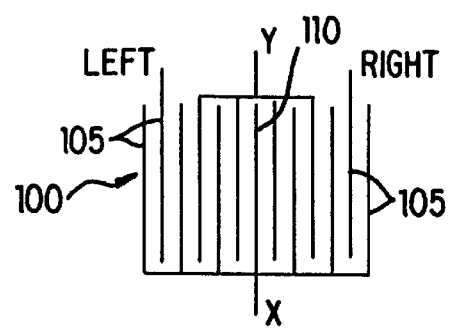
FIG. 6 is a top plan view of a circuit pattern on a circuit board according to a first embodiment of the present invention.

The circuit board 50 has a pattern of electrical contacts 100, shown in FIG. 6, which is repeated below each of the multifunction keys 14. The pattern of electrical contacts 100 consists of a series of parallel electrical contact lines 105 which extend perpendicular to the axis of curvature of the convex profile 62. Each pattern 100 has a central electrical contact 110 formed along line X-Y disposed in the middle of the pattern of electrical contacts 100.

The ▲ key 24 is a mode key, and determines the mode of the multifunction keys 14. The multifunction keys 14 are thus placed in one of two modes. A first mode is a primary mode or numerical mode. In the primary mode, the multifunction keys 14 will only produce the primary character 32. In the embodiment illustrated in FIG. 1, the primary characters are predominantly numbers "0–9", and therefore, the primary mode can be referred to as a numerical mode. By depressing the ▲ key 24, the data entry device 10 switches from primary mode to multifunction mode, and vice-versa.

In primary mode, only the primary character 32 is produced when a multifunction key 14 is depressed. Secondary characters 34 are disabled in the primary mode. In the multifunction mode, the multifunction keys 14 can only produce secondary characters 34. Instead of producing a primary character 14, the central electrical contact 110 indicates which of the multifunction keys is depressed, and the electrical contact lines 105 determine which secondary character 34 is desired, as discussed below. All characters, primary and secondary are produced upon depression of the keys 14, not upon their release. In primary mode, when a multifunction key 14 is depressed so that it will produce its primary character, the user depresses the key 14 by applying enough force to overcome the resilient bias of arms 60, so that the central electrical contact 110 comes in to contact with the convex profile 62 of the actuator 64. As a result, the circuit board 50 interacts with the CPU to cause the primary character for that multifunction key to be registered on the LCD 12.

If the user wants to enter one of the secondary characters on a multifunction key 14, the ▲ key 24 is pressed to change to multifunction mode, and force is applied both vertically and simultaneously on an angle toward the desired secondary character on one side of the multifunction key 14. As a result the multifunction key 14 moves downward toward the circuit board 50 against the bias of the resilient arms 60. The convex profile 62 of the actuator 64 contacts the central electrical contact 110 as well as simultaneously contacting the parallel electrical contact lines 105 on one side of the central electrical contact 110. The force at an angle determines which electrical contact lines 105 make contact with the convex profile 62 of the actuator 64. In such a situation, depending upon the software programmed into the CPU, the contact between the actuator 64 and the electrical contact lines 105 over-rides the input created by the contact between the actuator 64 and the central contact line 110, or the contact of the actuator 64 and the electrical contact lines 105 and the contact between the actuator 64 and the central contact line 110 combine so that the secondary character registers on the LCD 12.

Since the actuator 64 has a convex profile 62 the electrical contact lines 105 on either side of central contact line 110 can not make contact with the actuator 64 at the same time. Such a situation would create a conflict which the CPU could not interpret. A reverse configuration of the actuator and the parallel contact lines could be employed, as could other configurations of differing length actuators without departing from the scope of the present invention.

In the first embodiment of FIGS. 1–3, the primary characters are the numbers "0–9", "-", and ".". Each of the thirteen multifunction keys 14 has two letters "A–Z" as its secondary characters. No specific provision is made for upper case letters. The letters by default are all upper case. However, the three function keys F1, F2, and F3 are programmable, and in an application where upper and lower case characters are desired, one of the three function keys may be programmed to work as a shift key so that both upper and lower case letters may be displayed.

While only three function keys F1, F2, and F3 are provided on the device 10, the ▲ key can be employed to provide three additional functions by ▲ key depression followed by one of the F1, F2, and F3 keys.

Figure 4:
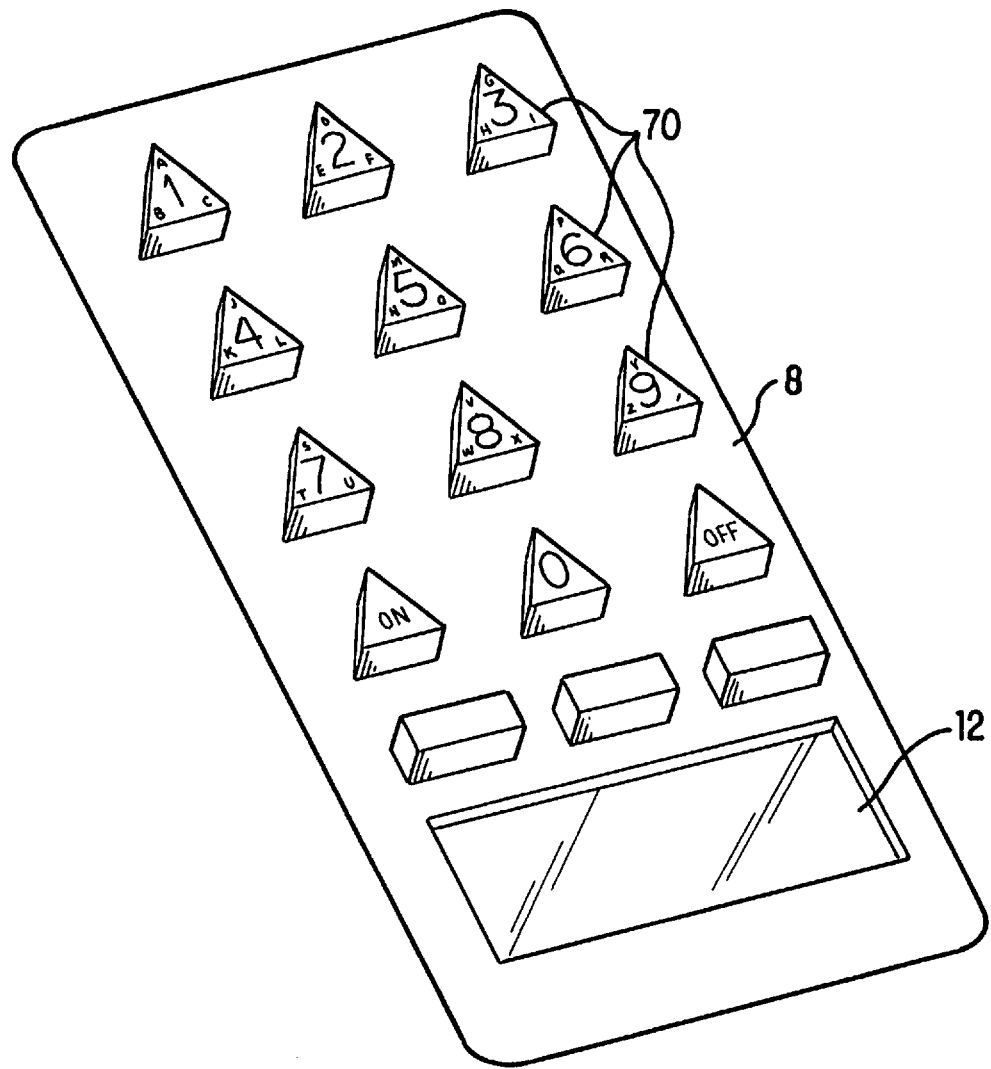
FIG. 4 is an arrangement of multifunction keys according to a second embodiment of the present invention.

Referring to FIG. 4, a second embodiment of the data entry device of the present invention is illustrated. In this embodiment the multifunction keys 70 are triangular instead of oval. Each multifunction key 70 can produce up to four characters. The primary character is displayed in the center of each triangular key 70. The three secondary characters are displayed at the corners of the triangle. The primary characters are numbers "0–9", and the secondary characters are "-", and ".", and letters "A–Z".

The total number of keys on the device 10 of the second embodiment is less than the number used in the first embodiment. The remaining keys are comparable to the keys of the first embodiment. The keys 70 interact with the circuit board 50 in the same manner as the keys 14 of the first embodiment. The primary character is produced when a vertical force is applied to the center of the key 70 causing only a central contact 120 on the circuit board 50. When a corner of a key 70 is depressed, both the central contact 120 and arcuate surrounding contact lines 225 make contact with the actuator 64 in the same manner as described above with regard to the first embodiment. Each key 70 has a convex profile which curves about more than one axis. The curvature of the actuator 64 may form an arcuate portion of a sphere. As was the case with the first embodiment, the curvature of the actuator prevents arcuate surrounding contact lines 225 on different sides of the central contact 120 from making simultaneous contact with the actuator 64.

Figure 7:
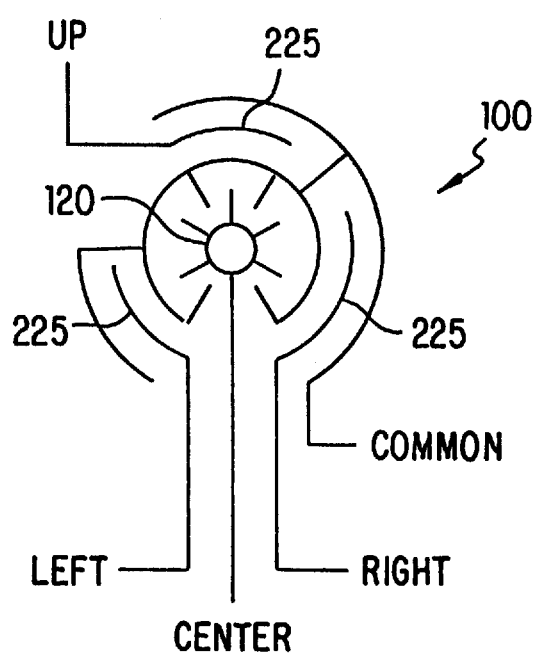
FIG. 7 is a top plan view of a circuit pattern on a circuit board according to the second embodiment of the present invention.

The circuit board 50 has a pattern of electrical contacts 100, shown in FIG. 7, which is repeated below each of the multifunction keys 70. The pattern of electrical contacts 100 consists of a series of arcuate contact lines 225 which form three arcs aground the central contact 120. Each pattern 100 has 25 a central electrical contact 120 formed in the middle of the pattern of electrical contact lines 225.

Figure 5:
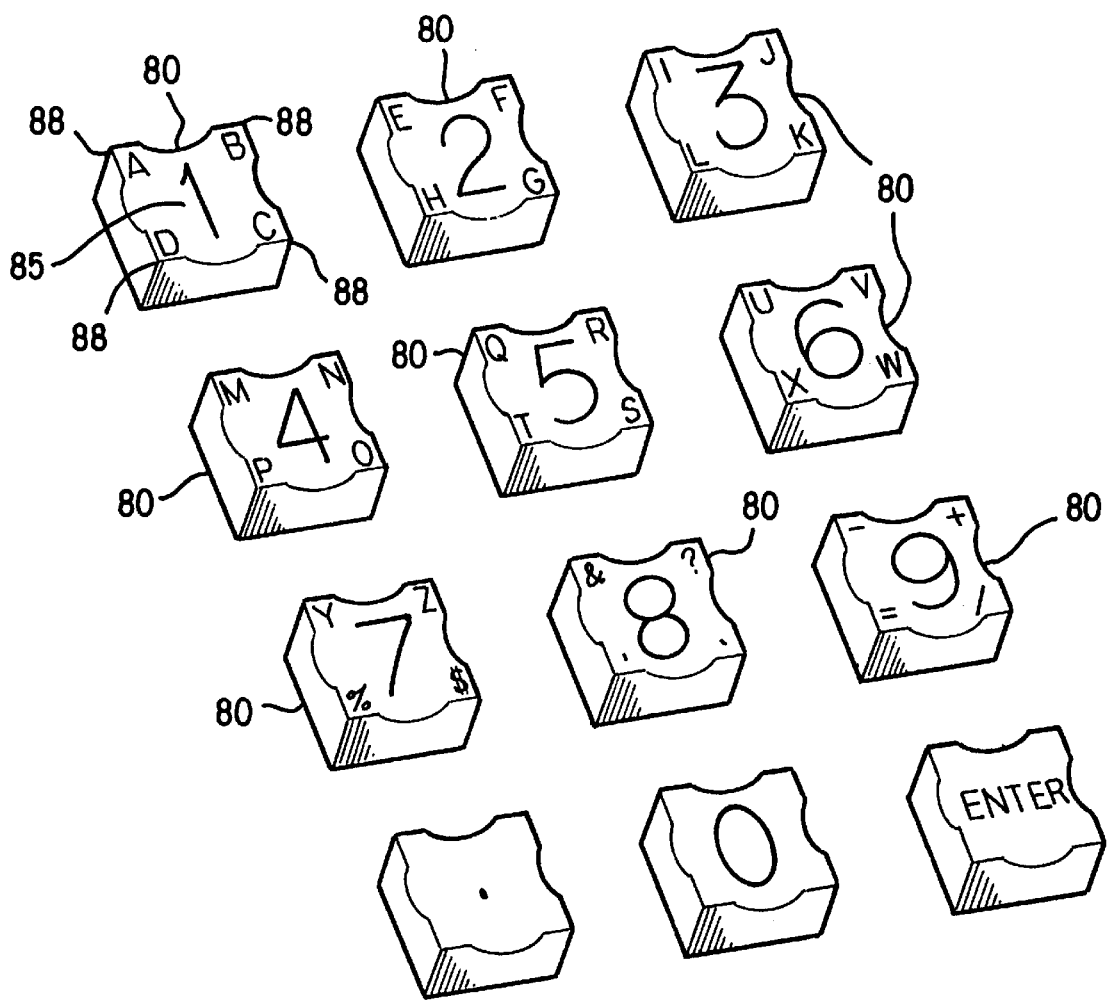
FIG. 5 is a keyboard arrangement of multifunction keys according to a third embodiment of the present invention.

The keys 80 of a third embodiment of the data entry device of the present invention are shown in FIG. 5. The keys 80 are rectangular. The centers 85 of the top of each key 80 is lower than the corners 88. The primary character for each key 80 is located in the center 85, while the secondary characters are located at the corners 88 of each multifunction key 80. Thus, each multifunction key 80 can produce up to five characters. The illustrated embodiment shows numbers "0–9", and the primary characters and "-", ".", "&", "+", "?", "=", "%", "$", "/", "," and letters "A–Z" as the secondary characters.

The keys 80 function in a manner similar to the keys 14 and 70 of the first and second embodiments, respectively, discussed above. Each key 80 has a convex profile which curves about more than one axis. The curvature of the actuator 64 may form an arcuate portion of a sphere. As was the case with the first embodiment, the curvature of the actuator prevents contact lines 125 on different sides of the central contact 120 from making simultaneous contact with the actuator 64.

In all of the three embodiments, the multifunction keys have shapes which transmit unique tactile sensations to the fingers of the user thereby helping the user select the desired character. In the third embodiment, the raised corners 88 provide additional tactile sensation to the user. While pentagonal, hexagonal, etc., shaped keys can be employed and are considered to fall within the scope of the present invention, the ability to transmit accurate sensation to the user and thereby display the desired character decreases with each increase in the complexity of the keys. In all three embodiments characters are registered upon depression. However, it is contemplated that registration could occur upon release of the key as opposed to depression.

The data entry device 10 of the present invention is intended to function as a hand-held portable unit. It would be powered by an internal power source such as batteries, and would be small enough to fit into a jacket or pants pocket. The data entry device is preferably 3" wide, 7.5" long and 2" thick. The weight including batteries is less than eight ounces. The LCD 12 is capable of displaying up to eight lines of twenty characters each. The device may have a built in bar code reader, such, as a laser scanner, CCD or bar contact reader. Such a bar code reader could be used to track packages or other inventory. The CPU would contain memory, preferably at least 1 Megabyte.

Having described the preferred embodiments of the data entry device of the present invention, it is believed that other modifications, variations and changes will be suggested to those skilled in the art in view of the description set forth above. For example, the primary characters need not be numbers and can be letters as well as other characters. The primary characters may be the most commonly used letters. Furthermore, as stated previously, the shape of the multifunction keys can be different, such as pentagonal, hexagonal, octagonal, trapezoidal, or other geometric shape. It is therefor to be understood that all such variations, modifications and changes are believed to fall within the scope of the invention as defined in the appended claims.

What is claimed is:

1. A data entry device comprising:

a power source;

a keyboard having a plurality of multifunction keys, each of said plurality of multifunction keys producing one of a primary character and one of at least two secondary characters on a display when said multifunction keys are depressed by a user, each of said plurality of multifunction keys having an actuator with a convex profile on a bottom surface of said multifunction keys; and a circuit board disposed below said keyboard, said circuit board having a central electrical contact and a series of outer electrical contacts;

wherein each of said plurality of multifunction keys produces said primary character when depressed vertically along an axis of said multifunction keys so that said actuator makes contact with only said central electrical contact, and wherein each of said plurality of multifunction keys produces said one of said at least two secondary characters when depressed vertically along said axis and simultaneously at an edge of said multifunction key, so that said actuator makes contact with said central contact and ones of said series outer electrical contacts.

2. A data entry device as recited in claim 1, wherein said display is disposed in said data entry device.

3. A data entry device as recited in claim 1, wherein said plurality of multifunction keys are oval shaped.

4. A data entry device as recited in claim 3, wherein each of said plurality of multifunction keys has said primary character represented at a center of said oval shaped key and said at least two secondary characters on opposite sides of said primary character at edges of said oval.

5. A data entry device as recited in claim 1, wherein said plurality of multifunction keys each has three secondary characters.

6. A data entry device as recited in claim 5, wherein said plurality of multifunction keys are triangle shaped, and each of said plurality of multifunction keys displays said primary character at a center of said triangle shaped key and said three secondary characters on corners of said triangle shaped key.

7. A data entry device as recited in claim 1, wherein said plurality of multifunction keys each has four secondary characters.

8. A data entry device as recited in claim 7, wherein said plurality of multifunction keys are rectangle shaped, and each of said plurality of multifunction keys displays said primary character at a center of said rectangle shaped key and said four secondary characters on corners of said rectangle shaped key.

9. A data entry device as recited in claim 8, wherein a top surface of each of said plurality of rectangle shaped multifunction keys has raised corners.

10. A data entry device as recited in claim 1, wherein said primary characters include numbers.

11. A data entry device as recited in claim 1, wherein said secondary characters include letters.

12. A data entry device as recited in claim 1, wherein said secondary characters include numbers and punctuation symbols.

13. A data entry device as recited in claim 1, wherein said data entry device is hand-held and portable.

14. A data entry device comprising:

a power source;

a keyboard having a plurality of multifunction keys, each of said plurality of multifunction keys producing one of a primary character and one of at least two secondary characters on a display when said multifunction keys are depressed by a user, each of said plurality of multifunction keys having an actuator with an arcuate profile on a bottom surface of said multifunction keys; and a circuit board disposed below said keyboard, said circuit board having a central electrical contact and a series of outer electrical contacts;

wherein each of said plurality of multifunction keys produces said primary character when depressed vertically along an axis of said multifunction keys so that said actuator makes contact with only said central electrical contact, and wherein each of said plurality of multifunction keys produces said one of said at least two secondary characters when depressed vertically along said axis and simultaneously at an edge of said multifunction key, so that said actuator makes contact with said central contact and ones of said series outer electrical contacts.

15. A data entry device as recited in claim 14, wherein said arcuate profile is convex.

16. A data entry device as recited in claim 1, further comprising a mode key for switching from a primary mode to a multifunction mode, wherein, when in a primary mode, said multifunction key is only produced said primary character, and in said secondary mode, said multifunction keys only produce seconary characters.

17. A data entry device as recited in claim 14, further comprising a mode key for switching from a primary mode to a multifunction mode, wherein, when in a primary mode, said multifunction key is only produced said primary character, and in said secondary mode, said multifunction keys only produce secondary characters.

* * * * *